(12) United States Patent
Han

(10) Patent No.: US 10,418,100 B2
(45) Date of Patent: Sep. 17, 2019

(54) RRAM SUBARRAY STRUCTURE PROVING AN ADAPTIVE READ REFERENCE CURRENT

(71) Applicant: XI'AN UNIIC SEMICONDUCTORS CO., LTD., Shaanxi (CN)

(72) Inventor: Xiaowei Han, Shaanxi (CN)

(73) Assignee: XI'AN UNIIC SEMICONDUCTORS CO., LTD., Shaanxi (CN)

( * ) Notice: Subject to any disclaimer, the term of this patent is extended or adjusted under 35 U.S.C. 154(b) by 39 days.

(21) Appl. No.: 15/563,014

(22) PCT Filed: Jan. 26, 2016

(86) PCT No.: PCT/CN2016/072176
§ 371 (c)(1),
(2) Date: Sep. 29, 2017

(87) PCT Pub. No.: WO2016/155410
PCT Pub. Date: Oct. 6, 2016

(65) Prior Publication Data
US 2018/0366186 A1     Dec. 20, 2018

(30) Foreign Application Priority Data
Mar. 30, 2015   (CN) .......................... 2015 1 0144347

(51) Int. Cl.
*G11C 11/56* (2006.01)
*G11C 13/00* (2006.01)
(Continued)

(52) U.S. Cl.
CPC ............ *G11C 13/004* (2013.01); *G11C 7/062* (2013.01); *G11C 7/14* (2013.01); *G11C 11/1653* (2013.01);
(Continued)

(58) Field of Classification Search
CPC .... G11C 13/004; G11C 13/0069; G11C 16/26
(Continued)

(56) References Cited

U.S. PATENT DOCUMENTS 7,450,432 B2   11/2008   Wang
8,116,127 B2    2/2012   Cho et al.
(Continued)

FOREIGN PATENT DOCUMENTS

| CN | 101231888 A | 7/2008 |
|---|---|---|
| CN | 101266834 A | 9/2008 |

(Continued)

OTHER PUBLICATIONS

International Search Report was dated Apr. 26, 2016 by the International Searching Authority for International Application No. PCT/CN2016/072176, which was filed on Jan. 26, 2016 and published as WO 2016/155410-A1 on Oct. 6, 2016 (Applicant—Xi'an Uniic Semiconductors Co., Ltd.) (Original—5 pages // Translated—3 pages).

(Continued)

*Primary Examiner* — Xiaochun L Chen
(74) *Attorney, Agent, or Firm* — Ballard Spahr LLP

(57) ABSTRACT

An RRAM storage subarray structure, and reading and writing methods therefore. The RRAM subarray structure comprises a main array and a reference array. Any one column in the reference array comprises a first bit line, a second bit line and a source line, and comprises n/2 memory cells connected in parallel between the first bit line and the source line and n/2 memory cells connected in parallel between the second bit line and the source line, wherein k columns of memory cells in the reference array share the source line, and any one column in the reference array can be used as a reference cell. By providing an adaptive read reference current, the RRAM subarray structure increases (Continued)

the read margin and improves the read speed and success rate.

21 Claims, 4 Drawing Sheets

(51) Int. Cl.
*G11C 7/06* (2006.01)
*G11C 7/14* (2006.01)
*G11C 11/16* (2006.01)

(52) U.S. Cl.
CPC ...... *G11C 11/1673* (2013.01); *G11C 13/0028* (2013.01); *G11C 13/0069* (2013.01); *G11C 7/067* (2013.01); *G11C 2013/0054* (2013.01); *G11C 2213/79* (2013.01); *G11C 2213/82* (2013.01)

(58) Field of Classification Search
USPC ........................................................ 365/148
See application file for complete search history.

(56) References Cited

U.S. PATENT DOCUMENTS

| | | | |
|---|---|---|---|
| 9,082,509 B2* | 7/2015 | August | G11C 11/1673 |
| 2006/0028889 A1 | 2/2006 | Liaw | |
| 2006/0209585 A1 | 9/2006 | Tanizaki et al. | |
| 2008/0055971 A1 | 3/2008 | Kim et al. | |
| 2009/0027953 A1 | 1/2009 | Kang et al. | |
| 2010/0067281 A1 | 3/2010 | Xi et al. | |
| 2011/0261616 A1 | 10/2011 | Kim | |
| 2013/0103883 A1 | 4/2013 | Kim | |
| 2014/0169063 A1* | 6/2014 | August | G11C 11/1673 365/148 |
| 2014/0198581 A1 | 7/2014 | Kim et al. | |
| 2014/0204652 A1 | 7/2014 | Lee et al. | |
| 2015/0187393 A1 | 7/2015 | Ueda et al. | |

FOREIGN PATENT DOCUMENTS

| | | |
|---|---|---|
| CN | 101354916 A | 1/2009 |
| CN | 101388246 A | 3/2009 |
| CN | 101404179 A | 4/2009 |
| CN | 102870159 A | 1/2013 |
| CN | 103065682 A | 4/2013 |
| CN | 201410521542 | 9/2014 |
| CN | 104318956 A | 1/2015 |
| CN | 201510144347.8 | 3/2015 |
| CN | 104733047 A | 6/2015 |
| CN | 204680387 U | 9/2015 |
| JP | 2007-052558 A | 3/2007 |
| WO | PCT/CN2015/090690 | 9/2015 |
| WO | PCT/CN2016/072176 | 1/2016 |
| WO | WO 2014/068961 A1 | 9/2016 |
| WO | WO 2016/155410 A1 | 10/2016 |

OTHER PUBLICATIONS

International Search Report and Written Opinion were dated Dec. 25, 2015, by the International Searching Authority for International Application No. PCT/CN2015/090690, which was filed on Sep. 29, 2015 and published as WO 2016/050170 on Apr. 7, 2016 (Applicant—Xi'an Uniic Semiconductors Co., Ltd.) (Original—8 pages // Translation—8 pages).

International Preliminary Report on Patentability was dated Apr. 4, 2017, by the International Searching Authority for International Application No. PCT/CN2015/090690, which was filed on Sep. 29, 2015 and published as WO 2016/050170 on Apr. 7, 2016 (Applicant—Xi'an Uniic Semiconductors Co., Ltd.) (Original—5 pages).

Restriction Requirement dated Jun. 29, 2018 by the U.S. Patent and Trademark Office for U.S. Appl. No. 15/515,359, filed Jul. 5, 2017 and published as US 2017/0301399 on Oct. 19, 2017 (Inventor—Xiaowei Han; Applicant—Xi'an Uniic Semiconductors Co., Ltd.; (8 pages).

U.S. Appl. No. 15/515,359, filed Jul. 5, 2017, Xiaowei Han.

* cited by examiner

RRAM SUBARRAY STRUCTURE PROVING AN ADAPTIVE READ REFERENCE CURRENT

CROSS-REFERENCE TO RELATED APPLICATIONS

This application is a U.S. National Phase Application of International Application No. PCT/CN2016/072176, filed Jan. 26, 2016, which claims priority to Chinese Application No. 201510144347.8, filed Mar. 30, 2015, each of which are hereby incorporated by reference in their entirety.

TECHNICAL FIELD

The present invention relates to the field of non-volatile random access memory design. In particular, the present invention relates to a RRAM subarray structure comprising reference cells.

BACKGROUND ART

Recent years, led by the consumer markets including smart phones, smart TVs and tablets, flash memories have been developing rapidly. Nevertheless, due to complex mask patterns, exorbitant manufacturing costs, increasingly large word line leakage and crosstalk between cells, and increasingly small number of electrons in floating gates, the size reduction capacity of the flash memories is greatly limited. It is estimated that the development of the size reduction capacity will be difficult to continue when the size reduces to 1z nm. Thus, emerging non-volatile memories such as CBRAM, MRAM, PRAM and RRAM gain increasing attention, wherein resistive random access memory RRAM, by virtue of high speed, large capacity, low power consumption, low cost and high reliability, is regarded as the most powerful candidate for flash memories.

Nevertheless, due to the effect of process, voltage and temperature (PVT), as shown in FIG. 1, there is a serious consistency problem with the resistance of the RRAM resistive units; that is, there are deviations in the resistance between wafers, between chips on the same wafer, and between different regions on the same chip. In addition, the resistance in both a high resistance state and a low resistance state presents normal distribution in a certain range. Therefore, it is difficult to provide a current-mode read circuit with a relatively ideal reference current.

In addition, it is not feasible to use a fixed reference current for it cannot track the deviations brought about by regions and temperatures in the high resistance state and low resistance state of the resistive units.

At present, it is common to use a shared reference cell to provide a reference current, as shown in FIG. 2. This allows tracking of the change of the resistance as the region and temperature change. Nevertheless, there is also a consistency problem with the resistance of the reference unit per se, and the reference currents generated by the reference unit also present normal distribution.

Therefore, it is necessary to find a suitable reference array structure to narrow the reference current distribution and improve the read margin, thereby increasing the read speed and read success rate.

CONTENTS OF THE INVENTION

To address the problem in the prior art, the present invention provides a RRAM subarray structure which improves the read margin and increase the read speed and read success rate by providing adaptive reading of reference currents.

The present invention is achieved by the following technical solutions:

According to a first aspect of the invention, there is provided a RRAM storage subarray structure comprising a main array and a reference array, wherein the main array comprises n rows and m columns of memory cells, and the reference array comprises n rows and k columns of memory cells, wherein n is a positive integer, m is a positive integer, and k is a positive integer greater than or equal to 2;

a memory cell in an $i^{th}$ row in the main array is connected to a memory cell in an $i^{th}$ row in the reference array by means of a main array word line WL<i> and a reference array word line REF_WL<i>, wherein the main array word line WL<i> and the reference array word line REF_WL<i> are connected, $0 \leq i \leq n-1$;

any one column in the main array comprises a main array bit line BL and a main array source line SL, and comprises n memory cells connected in parallel between the main array bit line BL and the main array source line SL;

any one column in the reference array comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL;

wherein K rows of memory cells in the reference array share the source line CSL, and any one column in the reference array can be used as a reference cell.

In a preferred embodiment of the RRAM storage subarray structure according to the present invention, the k is 2.

In a preferred embodiment of the RRAM storage subarray structure according to the present invention, the first bit line RBLH is connected to a read voltage Vread and the second bit line RBLL is connected to a ground line GND at the time of reading.

In a preferred embodiment of the RRAM storage subarray structure according to the present invention, the RRAM storage subarray structure also includes write reference switches WR_REF_SW<0> to WR_REF_SW<n-1>, and the write reference switches WR_REF_SW<0> to WR_REF_SW<n-1> have three ends which are connected to main array word lines WL<0> to WL<n-1>, reference array word lines REF_WL<0> to REF_WL<n-1> and a write reference enable signal WR_REF_EN, respectively.

In a preferred embodiment of the RRAM storage subarray structure according to the present invention, the RRAM storage subarray structure also includes read reference switches RD_REF_SW<0> to RD_REF_SW<n-1>, and the read reference switches RD_REF_SW<0> to RD_REF_SW<n-1> have three ends which are connected to reference array word lines REF_WL<0> to REF_WL<n-1>, a reference array read word line voltage RD_REF_WL and a read reference enable signal RD_REF_EN, respectively.

In a preferred embodiment of the RRAM storage subarray structure according to the present invention, during writing to the reference cell, the write reference enable signal WR_REF_EN is active, the read reference enable signal RD_REF_EN is inactive, then all the write reference switches are turned on, all the read reference switches are turned off, the reference array read word line voltage RD_REF_WL is connected to GND, and a corresponding reference array word line REF_WL<t> is selected for writing according to a main array word line WL<t>, wherein 0≤t≤n−1.

In a preferred embodiment of the RRAM storage subarray structure according to the present invention, when the reference cell is used as a read reference, the write reference enable signal WR_REF_EN is inactive, the read reference enable signal RD_REF_EN is active, then all the write reference switches are turned off, all the read reference switches are turned on, the reference array read word line voltage RD_REF_WL is connected to a chip supply voltage VDD, and all the reference array word lines are turned on for reading.

In a preferred embodiment of the RRAM storage subarray structure according to the present invention, n is 32 and m is 128.

In a preferred embodiment of the RRAM storage subarray structure according to the present invention, before data is read, all the memory cells in the reference array are written to a low resistance state.

According to a second aspect of the invention, there is provided a reading method of a storage RRAM subarray structure, wherein the RRAM storage subarray structure comprises a main array and a reference array, wherein the main array comprises n rows and m columns of memory cells, and the reference array comprises n rows and k columns of memory cells, wherein n is a positive integer, m is a positive integer, and k is a positive integer greater than or equal to 2;

a memory cell in an $i^{th}$ row in the main array is connected to a memory cell in an $i^{th}$ row in the reference array by means of a main array word line WL<i> and a reference array word line REF_WL<i>, wherein the main array word line WL<i> and the reference array word line REF_WL<i> are connected, 0≤i≤n−1;

any one column in the main array comprises a main array bit line BL and a main array source line SL, and comprises n memory cells connected in parallel between the main array bit line BL and the main array source line SL;

any one column in the reference array comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL;

wherein K rows of memory cells in the reference array share the source line CSL, and any one column in the reference array can be used as a reference cell;

the RRAM storage subarray structure also includes write reference switches WR_REF_SW<0> to WR_REF_SW<n−1>, and the write reference switches WR_REF_SW<0> to WR_REF_SW<n−1> have three ends which are connected to main array word lines WL<0> to WL<n−1>, reference array word lines REF_WL<0> to REF_WL<n−1> and a write reference enable signal WR_REF_EN, respectively;

the RRAM storage subarray structure also includes read reference switches RD_REF_SW<0> to RD_REF_SW<n−1>, and the read reference switches RD_REF_SW<0> to RD_REF_SW<n−1> have three ends which are connected to reference array word lines REF_WL<0> to REF_WL<n−1>, a reference array read word line voltage RD_REF_WL and a read reference enable signal RD_REF_EN, respectively;

the reading method comprises:

connecting the first bit line RBLH to a read voltage Vread and connecting the second bit line RBLL to a ground line GND; and setting the write reference enable signal WR_REF_EN to be inactive and the read reference enable signal RD_REF_EN to be active such that all the write reference switches are turned off, all the read reference switches are turned on and the reference array read word line voltage RD_REF_WL is connected to a chip supply voltage VDD, and all the reference array word lines are turned on for reading.

In a preferred embodiment of the reading method of the RRAM storage subarray structure according to the present invention, the k is 2.

In a preferred embodiment of the reading method of the RRAM storage subarray structure according to the present invention, n is 32 and m is 128.

In a preferred embodiment of the reading method of the RRAM storage subarray structure according to the present invention, before data is read, all the memory cells in the reference array are written to a low resistance state.

According to a third aspect of the invention, there is provided a writing method of a RRAM storage subarray structure, wherein the RRAM storage subarray structure comprising a main array and a reference array, wherein the main array comprises n rows and m columns of memory cells, and the reference array comprises n rows and k columns of memory cells, wherein n is a positive integer, m is a positive integer, and k is a positive integer greater than or equal to 2;

a memory cell in an $i^{th}$ row in the main array is connected to a memory cell in an $i^{th}$ row in the reference array by means of a main array word line WL<i> and a reference array word line REF_WL<i>, wherein the main array word line WL<i> and the reference array word line REF_WL<i> are connected, 0≤i≤n−1;

any one column in the main array comprises a main array bit line BL and a main array source line SL, and comprises n memory cells connected in parallel between the main array bit line BL and the main array source line SL;

any one column in the reference array comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL;

wherein K rows of memory cells in the reference array share the source line CSL, and any one column in the reference array can be used as a reference cell;

the RRAM storage subarray structure also includes write reference switches WR_REF_SW<0> to WR_REF_SW<n−1>, and the write reference switches WR_REF_SW<0> to WR_REF_SW<n−1> have three ends which are connected to main array word lines WL<0> to WL<n−1>, reference array word lines REF_WL<0> to REF_WL<n−1> and a write reference enable signal WR_REF_EN, respectively;

the RRAM storage subarray structure also includes read reference switches RD_REF_SW<0> to RD_REF_SW<n−1>, and the read reference switches RD_REF_SW<0> to RD_REF_SW<n−1> have three ends which are connected to reference array word lines REF_WL<0> to REF_WL<n−1>, a reference array read word line voltage RD_REF_WL and a read reference enable signal RD_REF_EN, respectively;

the writing method comprises:

setting the write reference enable signal WR_REF_EN to be active and the read reference enable signal RD_REF_EN to be inactive, such that all the write reference switches are turned on, all the read reference switches are turned off and the reference array read word line voltage RD_REF_WL is connected to GND, and a corresponding reference array word line REF_WL<i> is selected for writing according to a main array word line WL<i>.

In a preferred embodiment of the writing method of the RRAM storage subarray structure according to the present invention, the k is 2.

In a preferred embodiment of the writing method of the RRAM storage subarray structure according to the present invention, n is 32 and m is 128.

In a preferred embodiment of the writing method of the RRAM storage subarray structure according to the present invention, all the storage units in the reference array are written to a low resistance state before data is read.

According to a fourth aspect of the invention, there is provided a RRAM storage subarray structure comprising a reference cell; the RRAM storage subarray structure comprises a main array and a reference array, wherein the main array comprises n rows and m columns of memory cells, and the reference array comprises n rows and 2 columns of memory cells, wherein n is a positive integer and m is a positive integer;

and the memory cells in the main array and the memory cells in the reference array are connected in order by word lines arranged in rows;

any one column in the main array comprises a main array bit line BL and a main array source line SL, and comprises n memory cells connected in parallel between the main array bit line BL and the main array source line SL;

any one column in the reference array can be used as a reference cell; each column of the reference cells comprises n memory cells configured by series connection of two stages of n/2 memory cells connected in parallel; each column of the reference cells comprises a first bit line RBLH, a second bit line RBLL and a source line CSL, and two columns of the reference cells share the source line CSL; the first bit line RBLH and the second bit line RBLL are each connected to n/2 memory cells and the two stages of the n/2 memory cells connected in parallel are then connected in series by means of CSL; and the first bit line RBLH is connected to a read voltage Vread and the second bit line RBLL is connected to a ground line GND at the time of reading.

Preferably, the RRAM storage subarray structure also includes read reference switches RD_REF_SW<n-1:0>, and write reference switches WR_REF_SW<n-1:0> arranged on word lines between the main array and the reference array; and the read reference switches RD_REF_SW<n-1:0> have three ends which are connected to reference array word lines, a reference array read word line voltage RD_REF_WL and a read reference enable signal RD_REF_EN, respectively; and the write reference switches WR_REF_SW<n-1:0> have three ends which are connected to main array word lines, a reference array word line and a write reference enable signal WR_REF_EN, respectively.

Further, during writing to the reference cell,

WR_REF_EN is active and WR_REF_SW<n-1:0> is turned on, RD_REF_EN is inactive and RD_REF_SW<n-1:0> are turned off, RD_REF_WL is connected to GND, and a corresponding reference array word line REF_WL<i> ($0 \leq i \leq n-1$) is selected for writing according to WL<i> ($0 \leq i \leq n-1$).

Further, when the reference cell is used as a read reference,

WR_REF_EN is inactive and WR_REF_SW<n-1:0> is turned off, RD_REF_EN is active and RD_REF_SW<n-1:0> is turned on, RD_REF_WL is connected to a chip supply voltage VDD, all REF_WL<n-1:0> are turned on, and n reference cells form a two-stage structure by series connection of n/2 cells connected in parallel.

Preferably, all the storage units in the reference array are written to a low resistance state before data is read.

The present invention has, over the prior art, the following advantageous technical effects:

The present invention provides a RRAM subarray structure comprising reference cells, and each column of the reference cells has a structure formed first by parallel connection and then by series connection. By optimizing the number of parallel units and the number of series stages, it is possible to provide an adaptive read reference current while saving area and simplifying the control logic, thereby improving the reading speed and success rate. By arranging k columns (preferably two columns) of reference cells which share a source line in the reference array, a redundancy scheme is achieved to ensure the reproducibility of the read reference current.

Further, by controlling two sets of switches and corresponding control signals, it is possible to accurately and quickly read from and write to the cells in the reference cell and to form a reference array; the structure is ingenious and allows simple and convenient logic control.

Further, all the reference cells are selected to be in a low resistance state, which greatly narrows the reference current distribution, increases the read margin, and better improves the reading speed and read success rate.

MODE OF CARRYING OUT THE INVENTION

The present invention will be further described in detail with reference to the specific examples below, and the following descriptions only explain rather than limit the present invention.

Figure 1:
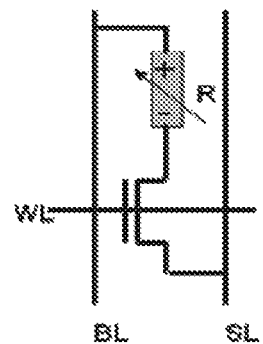
FIG. 1 is a diagram of the structure of a RRAM memory cell in a 1T1R structure in the prior art.
Figure 2:
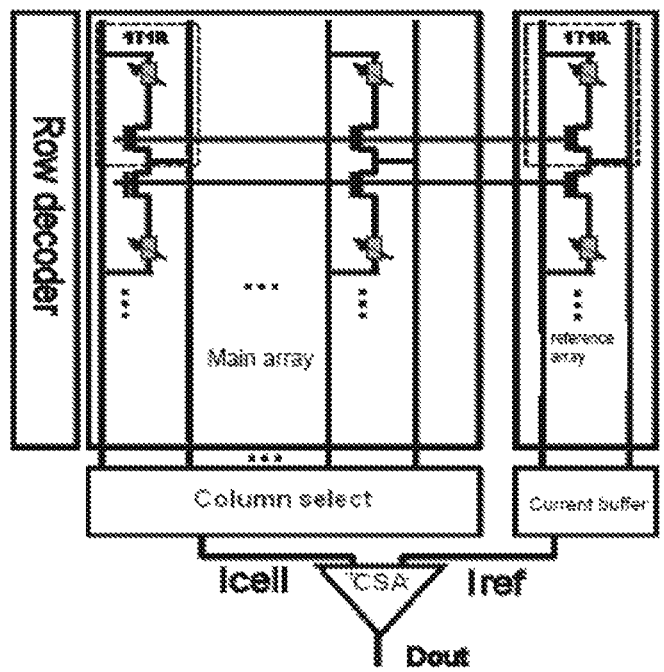
FIG. 2 is a diagram of a storage array based on a 1T1R memory cell in the prior art.
Figure 3:
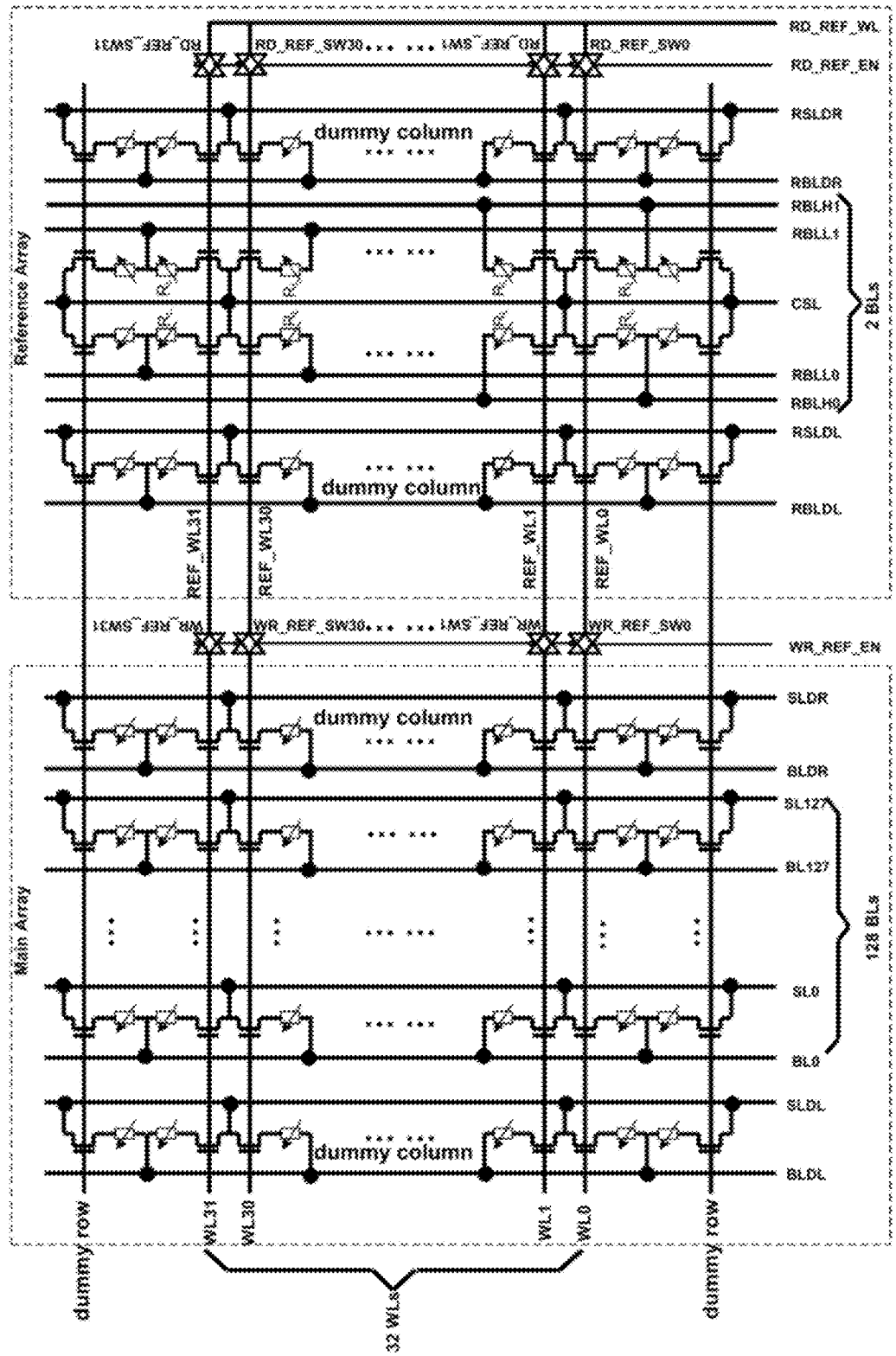
FIG. 3 is a diagram of a RRAM storage subarray structure in a preferred embodiment of the present invention.

In a preferred embodiment of the present invention, the RRAM storage subarray structure comprises a main array and a reference array, wherein the main array comprises n rows and m columns of memory cells, and the reference array comprises n rows and k columns of memory cells, wherein n is a positive integer, m is a positive integer, and k is a positive integer greater than or equal to 2. As shown in FIG. 3, for example, the main array comprises 32 rows and 128 columns of memory cells, and the reference array comprises 32 rows and 2 columns of memory cells.

In a preferred embodiment of the present invention, a memory cell in an $i^{th}$ row in the main array of the RRAM storage subarray structure is connected to a corresponding memory cell in an $i^{th}$ row in the reference array by means of a main array word line WL<i> and a reference array word line REF_WL<i>, wherein the main array word line WL<i> and the reference array word line REF_WL<i> are connected, $0 \le i \le n-1$. For example, a memory cell in an $10^{th}$ row in the main array is connected to a corresponding memory cell in an $10^{th}$ row in the reference array by means of a main array word line WL<10> and a reference array word line REF_WL<10>, wherein the main array word line WL<10> and the reference array word line REF_WL<10> are connected.

In a preferred embodiment of the present invention, any one column in the main array of the RRAM storage subarray structure comprises a main array bit line BL and a main array source line SL, and comprises n memory cells connected in parallel between the main array bit line BL and the main array source line SL. As shown in FIG. 3, for example, any one column in the main array of the RRAM storage subarray structure comprises a main array bit line BL and a main array source line SL, and comprises 32 memory cells connected in parallel between the main array bit line BL and the main array source line SL.

In a preferred embodiment of the present invention, any one column in the reference array of the RRAM storage subarray structure comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL. As shown in FIG. 3, for example, any one column in the reference array comprises a first bit line RBLH, a second bit line RBLL and a source line CSL, and comprises 16 memory cells connected in parallel between the first bit line RBLH and the source line CSL and 16 memory cells connected in parallel between the second bit line RBLL and the source line CSL.

In a preferred embodiment of the present invention, K rows of memory cells in the reference array of the RRAM storage subarray structure share the source line CSL, and any one column in the reference array can be used as a reference cell. As shown in FIG. 3, for example, 2 rows of memory cells in the reference array share the source line CSL, and any one column in the reference array can be used as a reference cell.

At the time of reading, the first bit line RBLH in the reference array is connected to a read voltage Vread and the second bit line RBLL is connected to a ground line GND.

As shown in FIG. 3, the RRAM storage subarray structure also includes write reference switches WR_REF_SW<0> to WR_REF_SW<31>, and the write reference switches WR_REF_SW<0> to WR_REF_SW<31> have three ends which are connected to corresponding main array word lines WL<0> to WL<31>, reference array word lines REF_WL<0> to REF_WL<31> and a write reference enable signal WR_REF_EN, respectively.

As further shown in FIG. 3, the RRAM storage subarray structure also includes read reference switches RD_REF_SW<0> to RD_REF_SW<31>, and the read reference switches WR_REF_SW<0> to WR_REF_SW<31> have three ends which are connected to corresponding reference array word lines REF_WL<0> to REF_WL<31>, a reference array read word line voltage RD_REF_WL and a read reference enable signal RD_REF_EN, respectively.

During writing to the reference cell, the write reference enable signal WR_REF_EN is active, the read reference enable signal RD_REF_EN is inactive, then all the write reference switches (i.e., WR_REF_SW<0> to WR_REF_SW<31>) are turned on, all the read reference switches (i.e., RD_REF_SW<0> to RD_REF_SW<31>) are turned off, the reference array read word line voltage RD_REF_WL is connected to GND, and a corresponding reference array word line REF_WL is selected for writing according to a main array word line WL.

When the reference cell is used as a read reference, the write reference enable signal WR_REF_EN is inactive, the read reference enable signal RD_REF_EN is active, then all the write reference switches (i.e., WR_REF_SW<0> to WR_REF_SW<31>) are turned off, all the read reference switches (i.e., RD_REF_SW<0> to RD_REF_SW<31>) are turned on, the reference array read word line voltage RD_REF_WL is connected to a chip supply voltage VDD, and all the reference array word lines are turned on for reading.

Preferably, before data is read, all the memory cells in the reference array are written to a low resistance state.

Figure 4:
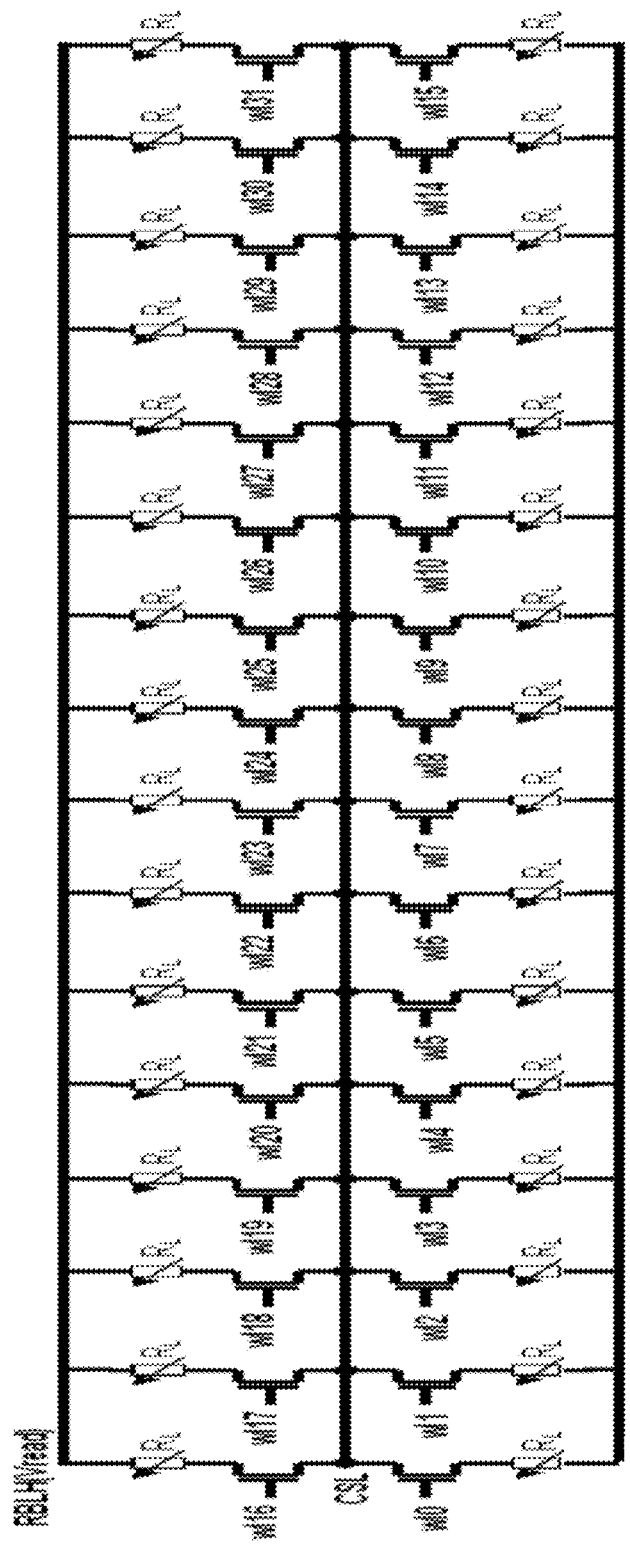
FIG. 4 is a diagram of a reference array structure of a storage subarray in a preferred embodiment of the present invention.

For a more clear understanding, FIG. 4 shows a reference array structure of a storage subarray in a preferred embodiment of the present invention. 32 memory cells in the reference cell form a two-stage structure by series connection of 16 memory cells connected in parallel. That is, the column in the reference array comprises a first bit line RBLH, a second bit line RBLL and a source line CSL, and comprises 16 memory cells connected in parallel between the first bit line RBLH and the source line CSL and 16 memory cells connected in parallel between the second bit line RBLL and the source line CSL, wherein 2 columns of reference cells share the source line CSL.

Figure 5:
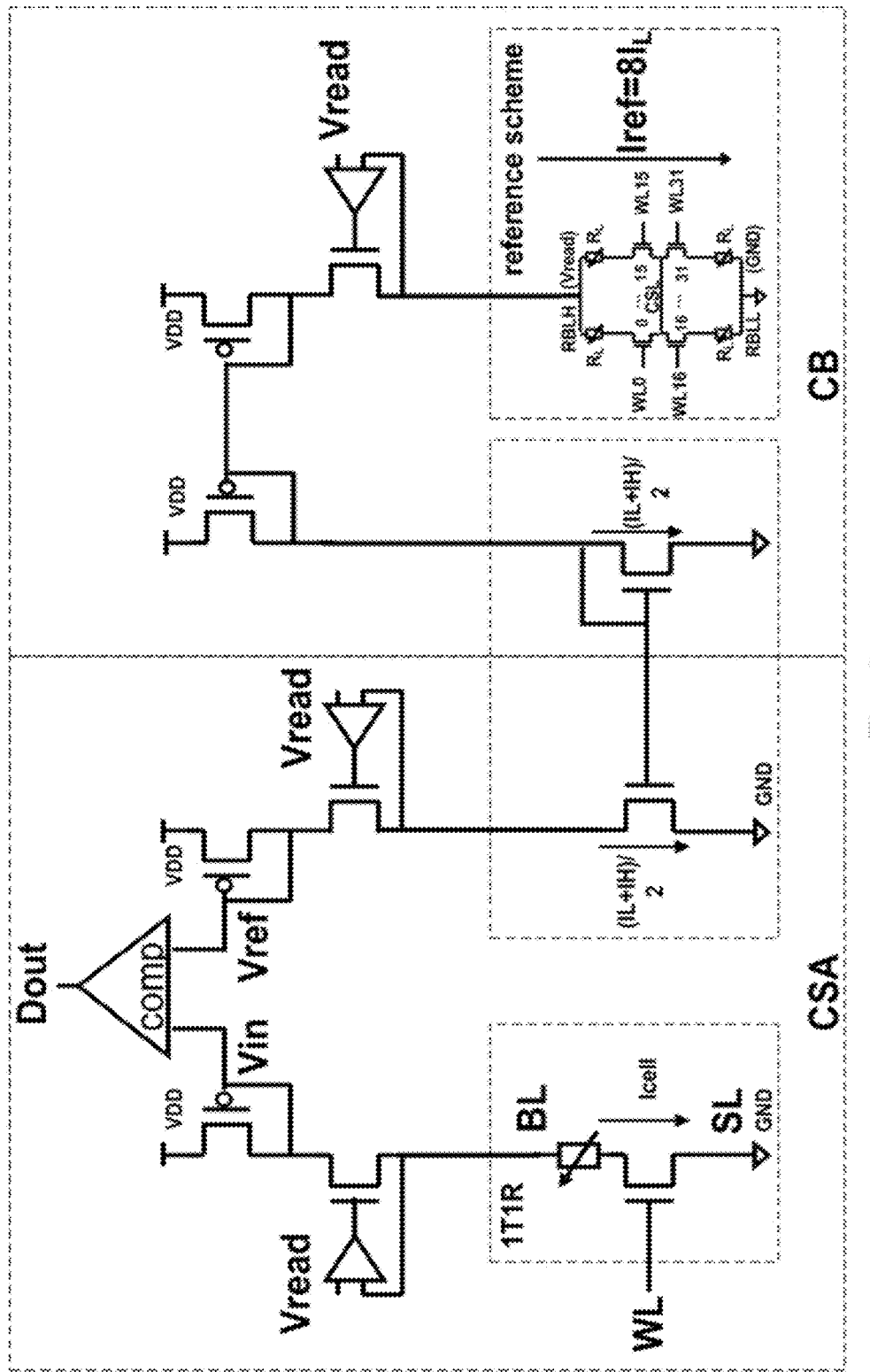
FIG. 5 is a diagram of the reading principle of a current mode sense amplifier based on the reference array structure of the present invention.

FIG. 5 is a diagram of the reading principle of a current mode sense amplifier based on the reference array structure of the present invention. When the reference array reads, RBLH is connected to a read voltage Vread and RBLL is connected to a ground line GND, with Iref being $8I_L$. The Iref is converted proportionally to $(I_H+I_L)/2$ via a current buffer CB. $(I_H+I_L)/2$ is fed into a reference arm of the current mode sensitive amplifier CSA. $(I_H+I_L)/2$ is compared with a target cell current Icell. If Icell is larger than $(I_H+I_L)/2$, dout is '1'; otherwise, dout is '0'.

While the above illustrates some preferred embodiments of the present invention, it should be realized that the embodiments of the present invention are not limited to these above. Various modifications to the present invention can be made without departing from the scope of the invention.

The invention claimed is:

1. A RRAM storage subarray structure, characterized in that, comprising a main array and a reference array,
wherein the main array comprises n rows and m columns of memory cells, and the reference array comprises n rows and k columns of memory cells, wherein n is a positive integer, m is a positive integer, and k is a positive integer greater than or equal to 2;
a memory cell in an $i^{th}$ row in the main array is connected to a memory cell in an $i^{th}$ row in the reference array by means of a main array word line WL<i> and a reference array word line REF_WL<i>, wherein the main array word line WL<i> and the reference array word line REF_WL<i> are connected, $0 \le i \le n-1$;

any one column in the main array comprises a main array bit line BL and a main array source line SL, and comprises n memory cells connected in parallel between the main array bit line BL and the main array source line SL;

any one column in the reference array comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL, wherein the first bit line RBLH is connected to a read voltage Vread and the second bit line RBLL is connected to a ground line GND at the time of reading;

wherein k columns of memory cells in the reference array share the source line CSL, and reference cells in any one column in the reference array can be used as a reference cell.

2. The RRAM storage subarray structure according to claim 1, characterized in that the k is 2.

3. The RRAM storage subarray structure according to claim 1, characterized in that the RRAM storage subarray structure also includes write reference switches WR_REF_SW<0> to WR_REF_SW<n-1>, and the write reference switches WR_REF_SW<0> to WR_REF_SW<n-1> have three ends which are connected to main array word lines WL<0> to WL<n-1 >, reference array word lines REF_WL<0> to REF_WL<n-1> and a write reference enable signal WR_REF_EN, respectively.

4. The RRAM storage subarray structure according to claim 3, characterized in that the RRAM storage subarray structure also includes read reference switches RD_REF_SW<0> to RD_REF_SW<n-1>, and the read reference switches RD_REF_SW<0> to RD_REF_SW<n-1> have three ends which are connected to reference array word lines REF_WL<0> to REF_WL<n-1>, a reference array read word line voltage RD_REF_WL and a read reference enable signal RD_REF_EN, respectively.

5. The RRAM storage subarray structure according to claim 4, characterized in that during writing to the reference cell, the write reference enable signal WR_REF_EN is active, the read reference enable signal RD_REF_EN is inactive, then all the write reference switches are turned on, all the read reference switches are turned off, the reference array read word line voltage RD_REF_WL is connected to GND, and a corresponding reference array word line REF_WL<t> is selected for writing according to a main array word line WL<t>, wherein 0≤t≤n-1.

6. The RRAM storage subarray structure according to claim 4, characterized in that when the reference cell is used as a read reference, the write reference enable signal WR_REF_EN is inactive, the read reference enable signal RD_REF_EN is active, then all the write reference switches are turned off, all the read reference switches are turned on, the reference array read word line voltage RD_REF_WL is connected to a chip supply voltage VDD, and all the reference array word lines are turned on for reading.

7. The RRAM storage subarray structure according to claim 1, characterized in that n is 32 and m is 128.

8. The RRAM storage subarray structure according to claim 1, characterized in that before data is read, all the memory cells in the reference array are written to a low resistance state.

9. A reading method of a RRAM storage subarray structure, characterized in that,
the RRAM storage subarray structure comprising a main array and a reference array,
wherein the main array comprises n rows and m columns of memory cells, and the reference array comprises n rows and k columns of memory cells, wherein n is a positive integer, m is a positive integer, and k is a positive integer greater than or equal to 2;

a memory cell in an ith row in the main array is connected to a memory cell in an ith row in the reference array by means of a main array word line WL<i> and a reference array word line REF_WL<i>, wherein the main array word line WL<i> and the reference array word line REF_WL<i> are connected, 0≤i≤n-1;

any one column in the main array comprises a main array bit line BL and a main array source line SL, and comprises n memory cells connected in parallel between the main array bit line BL and the main array source line SL;

any one column in the reference array comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL;

wherein k columns of memory cells in the reference array share the source line CSL, and reference cells in any one column in the reference array can be used as a reference cell;

the RRAM storage subarray structure also includes write reference switches WR_REF_SW<0> to WR_REF_SW<n-1>, and the write reference switches WR_REF_SW<0> to WR_REF_SW<n-1 > have three ends which are connected to main array word lines WL<0> to WL<n-1 >, reference array word lines REF_WL<0> to REF_WL<n-1> and a write reference enable signal WR_REF_EN, respectively;

the RRAM storage subarray structure also includes read reference switches RD_REF_SW<0> to RD_REF_SW<n-1 >, and the read reference switches RD REF SW<0> to RD REF SW<n-1> have three ends which are connected to reference array word lines REF_WL<0> to REF_WL<n-1>, a reference array read word line voltage RD_REF_WL and a read reference enable signal RD_REF_EN, respectively;

the reading method comprises:
connecting the first bit line RBLH to a read voltage Vread and connecting the second bit line RBLL to a ground line GND;

setting the write reference enable signal WR_REF_EN to be inactive and the read reference enable signal RD_REF_EN to be active such that all the write reference switches are turned off, all the read reference switches are turned on and the reference array read word line voltage RD_REF_WL is connected to a chip supply voltage VDD, and all the reference array word lines are turned on for reading.

10. The reading method of the RRAM storage subarray structure according to the claim 9, characterized in that the k is 2.

11. The reading method of the RRAM storage subarray structure according to the claim 9, characterized in that n is 32 and m is 128.

12. The reading method of the RRAM storage subarray structure according to the claim 9, characterized in that before data is read, all the memory cells in the reference array are written to a low resistance state.

13. A writing method of a RRAM storage subarray structure, characterized in that, the RRAM storage subarray structure comprising a main array and a reference array,
wherein the main array comprises n rows and m columns of memory cells, and the reference array comprises n rows and k columns of memory cells, wherein n is a positive integer, m is a positive integer, and k is a positive integer greater than or equal to 2;
a memory cell in an ith row in the main array is connected to a memory cell in an ith row in the reference array by means of a main array word line WL<i> and a reference array word line REF_WL<i>, wherein the main array word line WL<i> and the reference array word line REF_WL<i> are connected, $0 \le i \le n-1$;
any one column in the main array comprises a main array bit line BL and a main array source line SL, and comprises n memory cells connected in parallel between the main array bit line BL and the main array source line SL;
any one column in the reference array comprises a first bit line RBLH, a second bit line RBLL and a source line CSL, and comprises n/2 memory cells connected in parallel between the first bit line RBLH and the source line CSL and n/2 memory cells connected in parallel between the second bit line RBLL and the source line CSL;
whereink columns of memory cells in the reference array share the source line CSL, and reference cells in any one column in the reference array can be used as a reference cell;
the RRAM storage subarray structure also includes write reference switches WR_REF_SW<0> to WR_REF_SW<n−1>, and the write reference switches WR_REF_SW<0> to WR_REF_SW<n−1> have three ends which are connected to main array word lines WL<0> to WL<n−1>, reference array word lines REF_WL<0> to REF WL<n−1> and a write reference enable signal WR_REF_EN, respectively;
the RRAM storage subarray structure also includes read reference switches RD_REF_SW<0> to RD_REF_SW<n−1>, and the read reference switches RD_REF_SW<0> to RD_REF_SW<n−1> have three ends which are connected to reference array word lines REF_WL<0> to REF_WL<n−1>, a reference array read word line voltage RD_REF_WL and a read reference enable signal RD_REF_EN, respectively;
the writing method comprises:
setting the write reference enable signal WR_REF_EN to be active and the read reference enable signal RD_REF_EN to be inactive, such that all the write reference switches are turned on, all the read reference switches are turned off and the reference array read word line voltage RD_REF_WL is connected to GND, and a corresponding reference array word line REF_WL<i> is selected for writing according to a main array word line WL<i>.

14. The writing method of the RRAM storage subarray structure according to claim 13, characterized in that the k is 2.

15. The writing method of the RRAM storage subarray structure according to claim 13, characterized in that n is 32 and m is 128.

16. The writing method of the RRAM storage subarray structure according to claim 13, characterized in that all the memory cells in the reference array are written to a low resistance state before data is read.

17. A RRAM storage subarray structure comprising reference cells, characterized in that the RRAM storage subarray structure comprises a main array and a reference array, wherein the main array comprises n rows and m columns of memory cells, and the reference array comprises n rows and 2 columns of memory cells, wherein n is a positive integer and m is a positive integer; and the memory cells in the main array and the memory cells in the reference array are connected in order by word lines arranged in rows;
any one column in the main array comprises a main array bit line BL and a main array source line SL, and comprises n memory cells connected in parallel between the main array bit line BL and the main array source line SL;
reference cells in any one column in the reference array can be used as a reference cell; each column of the reference cells comprises n memory cells configured by series connection of two stages of n/2 memory cells connected in parallel; each column of the reference cells comprises a first bit line RBLH, a second bit line RBLL and a source line CSL, and two columns of the reference cells share the source line CSL; the first bit line RBLH and the second bit line RBLL are each connected to n/2 memory cells and the two stages of the n/2 memory cells connected in parallel are then connected in series by means of CSL; and the first bit line RBLH is connected to a read voltage Vread and the second bit line RBLL is connected to a ground line GND at the time of reading.

18. The RRAM storage subarray structure comprising reference cells according to claim 17, characterized in that, the RRAM storage subarray structure also includes read reference switches RD_RER_SW<n−1:0> and write reference switches WR_RER_SW<n−1:0> arranged on the word lines between the main array and the reference array; and the read reference switches RD_RER_SW<n−1:0> have three ends which are connected to reference array word lines, a reference array read word line voltage RD_RER_WL and a read reference enable signal RD_RER_EN, respectively; and the write reference switches WR RER SW<n−1:0> have three ends which are connected to main array word lines ,a reference array word line and a write reference enable signal WR_REF_EN, respectively.

19. The RRAM storage subarray structure comprising reference cells according to claim 18, characterized in that, during writing to the reference cell,
WR_RER_EN is active and WR_RER_SW<n−1:0> is turned on, RD_RER_EN is inactive and RD_RER_SW<n−1:0> are turned off, RD RER WL is connected to GND, and a corresponding reference array word line REF_WL<i>($0 \le i \le n-1$) is selected for writing according to WL<i>($0 \le i \le n-1$).

20. The RRAM storage subarray structure comprising reference cells according to claim 18, characterized in that, when the reference cell is used as a read reference,
WR_RER_EN is inactive and WR_RER_SW<n−1:0> is turned off, RD_RER_EN is active and RD RER SW<n−1:0> is turned on, RD_RER_WL is connected to a chip supply voltage VDD, all REF_WL<n−1:0> are turned on, and n reference cells form a two-stage structure by series connection of n/2 cells connected in parallel.

21. The RRAM storage subarray structure comprising reference cells according to claim 17, characterized in that, all the memory cells in the reference array are written to a low resistance state before data is read.

* * * * *